(12) United States Patent
Kwon et al.

(10) Patent No.: US 8,063,674 B2
(45) Date of Patent: Nov. 22, 2011

(54) MULTIPLE SUPPLY-VOLTAGE POWER-UP/DOWN DETECTORS

(75) Inventors: Chang Ki Kwon, San Diego, CA (US); Vivek Mohan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 165 days.

(21) Appl. No.: 12/365,559

(22) Filed: Feb. 4, 2009

(65) Prior Publication Data

US 2010/0194200 A1     Aug. 5, 2010

(51) Int. Cl.
H03L 7/00      (2006.01)
H03L 5/00      (2006.01)
H03K 5/153    (2006.01)
H03K 19/094   (2006.01)

(52) U.S. Cl. ............ 327/143; 327/72; 327/333; 326/68
(58) Field of Classification Search .............. 326/82, 326/83, 86, 87, 93, 112, 119; 327/333, 108
See application file for complete search history.

(56) References Cited

U.S. PATENT DOCUMENTS

| | | | | |
|---|---|---|---|---|
| 4,781,051 A * | 11/1988 | Schultes et al. | ................. | 72/247 |
| 5,130,569 A | 7/1992 | Glica | | |
| 5,495,453 A * | 2/1996 | Wojciechowski et al. | ........................ | 365/185.18 |
| 5,723,990 A * | 3/1998 | Roohparvar | .................... | 327/81 |
| 5,781,051 A * | 7/1998 | Sandhu | ........................ | 327/143 |
| 6,577,166 B2 * | 6/2003 | Lim | ................. | 327/77 |
| 6,646,844 B1 | 11/2003 | Matthews | | |
| 6,900,666 B2 * | 5/2005 | Kursun et al. | ................... | 326/95 |
| 7,253,655 B2 | 8/2007 | Kwon et al. | | |
| 2002/0163364 A1 | 11/2002 | Majcherczak | | |
| 2006/0044027 A1 * | 3/2006 | Chen | ........................... | 327/143 |
| 2006/0103437 A1 | 5/2006 | Kang | | |
| 2007/0030039 A1 | 2/2007 | Chen | | |
| 2008/0100341 A1 * | 5/2008 | Kim | ............................ | 326/63 |
| 2008/0218223 A1 * | 9/2008 | Kimura | ........................ | 327/142 |
| 2009/0027087 A1 * | 1/2009 | Sukup et al. | .................... | 327/72 |

FOREIGN PATENT DOCUMENTS

WO     2007091211     8/2007

OTHER PUBLICATIONS

International Search Report and Written Opinion—PCT/US2010/023081, International Search Authority—European Patent Office—Aug. 5, 2010.

* cited by examiner

*Primary Examiner* — Shawki Ismail
*Assistant Examiner* — Dylan White
(74) *Attorney, Agent, or Firm* — Sam Talpalatsky; Nicholas J. Pauley; Jonathan T. Velasco

(57) ABSTRACT

A multiple supply voltage device includes an input/output (I/O) network operative at a first supply voltage, a core network coupled to the I/O network and operative at a second supply voltage, and a power-on-control (POC) network coupled to the I/O network and the core network. The POC network is configured to transmit a POC signal to the I/O network and includes an adjustable current power up/down detector configured to detect a power state of the core network. The POC network also includes processing circuitry coupled to the adjustable current power up/down detector and configured to process the power state into the POC signal, and one or more feedback circuits. For reducing the leakage current while also improving the power-up/down detection speed, the feedback circuit(s) are coupled to the adjustable current power up/down detector and configured to provide feedback signals to adjust a current capacity of the adjustable current power up/down detector.

22 Claims, 8 Drawing Sheets

MULTIPLE SUPPLY-VOLTAGE POWER-UP/DOWN DETECTORS

TECHNICAL FIELD

The present disclosure is related, in general, to integrated circuit devices and, more particularly, to power up/down detectors for multiple supply voltages devices.

BACKGROUND

As technology has advanced there has been an increased ability to include more and more devices and components within integrated circuits. Semiconductor fabrication techniques have allowed these embedded devices to become smaller and have lower voltage requirements, while still operating at high-speeds. However, because these new integrated devices often interface with older technology devices or legacy products, input/output (I/O) circuits within the integrated circuit have remained at higher operating voltages to interface with the higher voltage requirements of these older systems. Therefore, many newer integrated circuit devices include dual power supplies: one lower-voltage power supply for the internally operating or core applications, and a second higher-voltage power supply for the I/O circuits and devices.

Core devices and applications communicate with operations outside of the integrated component through the I/O devices. In order to facilitate communication between the core and I/O devices, level shifters are employed. Because the I/O devices are connected to the core devices through level shifters, problems may occur when the core devices are powered-down. Powering down or power collapsing is a common technique used to save power when no device operations are pending or in progress. For example, if the core network is power collapsed, it is possible that the level shifters, whether through stray currents or the like, could send a signal to the I/O devices for transmission. The I/O devices assume that the core devices have initiated this communication, and will, therefore, transmit the erroneous signal into the external environment.

It has been found useful to have the I/O devices in a known state when the core networks are powered down. In order to guarantee these known states, solutions have included the addition of hardware or software for managing additional external signals to control the I/O circuitry. By using these external signals, the I/O circuitry can be controlled (e.g., placed in a known state) whenever the core power is collapsed. However, whether implementing this external signal management system using hardware or software, a considerable amount of delay is added to the operation of the integrated device. Although hardware is slightly faster than software controls, hardware solutions may have problems caused by significant additional power leakage on the I/O device side.

One hardware solution currently in use provides power-up/down detectors to generate a power-on/off-control (POC) signal internally. The POC signal instructs the I/O devices when the core devices are shut down. FIG. 1 is a circuit diagram illustrating standard POC system 10 for multiple supply voltage devices. POC system 10 is made up of three functional blocks: power-up/down detector 100, signal amplifier 101, and output stage 102. Power-up/down detector 100 has PMOS transistor M1 and NMOS transistors M2-M3. The gate terminals for each of M1-M3 are connected to core power supply 103, $V_{core}$. When core power supply 103 is power collapsed, M2 and M3 are switched off while M1 is switched on, pulling up the input node to amplifier 105 to $V_{I/O}$, i.e., I/O power supply 104. A "high" signal is input into amplifier 105 which inverts the output to a "low" signal. In output stage 102, the low signal from amplifier 105 is processed in output buffer 106 and again inverted to a high signal for POC 107. The high signal for POC 107 is transmitted to the I/O circuitry indicating that core power supply 103 has been shut down.

When core power supply 103, $V_{core}$, is on, M1 becomes very weak and M2 and M3 both switch strongly on, pulling the input node to amplifier 105 to $V_{SS}$, i.e., core power supply 103. $V_{SS}$ is considered the logical low signal. Therefore, amplifier 105 inverts it to a high signal which is then processed in output buffer 106 and inverted again to a low signal. This signal detection process operates acceptably when either I/O power supply 104 is on and core power supply 103 is power collapsed or when core power supply 103 is powered-up before I/O power supply 104 is powered-up. However, when I/O power supply 104 is powered-up before core power supply 103 powers-up, substantial current leakage may occur in the power up/down detector 100 or in the POC 10.

In the situation where I/O power supply 104 is on and core power supply 103 is off, M1 is switched on with M2 and M3 switched off. When core power supply 103 is then powered up, M2 and M3 switch on, and M1 becomes very weak. However, before M1 can switch completely off, there is a period in which all three transistors within power up/down detector 100 are on. Thus, a virtual short is created to ground causing a significant amount of current to flow from I/O power supply 104 to ground. This "glitch" current consumes unnecessary power.

In order to reduce this stray power consumption, one solution may be adopted to decrease the sizes of transistors M1-M3. By reducing the size of M1-M3, the actual amount of current that can pass through the transistors is physically limited. However, because the transistors are now smaller, their switching speeds are also reduced. The reduced switching speed translates into less sensitivity in detecting power-up/down of core supply voltage 103 or longer processing time for power-up/down events.

FIG. 2 is an illustration of diagram 20 presenting the signal interactions in POC circuit 10 of FIG. 1. Diagram 20 includes power supply diagram 21 and POC diagram 22. As I/O power supply 104 is powered up, there is a steady increase until it reaches $V_{I/O}$. POC 107 follows I/O power supply 104 as it powers up to reach the high level. Similarly, when I/O power supply 104 maintains steady at $V_{I/O}$ at time 200, POC 107 remains steady at the high signal. When core power supply 103 begins to power on at time 201 power up/down detector 100 (FIG. 1) takes a little time to actually detect this new power level. Once detected, at time 202, POC 107 is switched to the low value. POC 107 should, thereafter, remain at the low level until core power supply 103 is power collapsed, between times 203 and 205. Again, because power up/down detector 100 (FIG. 1) takes a little time to actually detect the new power level, POC 107 remains in the low state until time 204, when the powering down is actually detected by power up/down detector 100. This low state time, between time 202 and 204 is referred to as the normal operation region. Once core power supply 103 is completely off or power collapsed at time 205, the input to amplifier 105 (FIG. 1) is again pulled up to the high signal. POC 107 will then follow I/O power supply 104 as it also powers down between times 206 and 207.

The leakage current between I/O power supply 104 and ground can be lessened because of the smaller transistor size. Thus, during the time between times 201 and 205 any leakage that occurs is reduced. However, this reduced leakage comes at the price of faster detection. If POC circuit 10 may include the lower-threshold or bigger transistors, switching/detecting times would be faster. For example, as core power supply 103 begins to power up at time 201, the lower-threshold or bigger transistors of power up/down detector 100 would detect the power-up at time 208, instead of time 202. Moreover when core power supply 103 begins powering down at time 203, the power up/down detector 100 would detect the power-down at time 209, instead of time 204. This increase may be represented by the difference between the time periods of time 202 to 204 vs. time 208 to 209. Therefore, the conventional solutions still have problems with leakage and switching times.

SUMMARY

Various representative embodiments of the disclosure relate to integrated devices having multiple supply voltages. Further representative embodiments of the present disclosure relate to methods for reducing power consumption in a power on/off control (POC) network of a multiple supply voltage device. Additional representative embodiments of the present disclosure relate to systems for reducing power consumption in a POC network of a multiple supply voltage device.

A multiple supply voltage device includes a core network operative at a first supply voltage and a control network coupled to the core network. The control network is configured to transmit a control signal. The control network includes an up/down (up/down) detector configured to detect a power state of the core network. The control network further includes processing circuitry coupled to the up/down detector and is configured to generate the control signal based on the power state. The control network further includes one or more feedback circuits coupled to the up/down detector. The one or more feedback circuits are configured to provide feedback signals to adjust a current capacity of said up/down detector.

A method for reducing power consumption in a power on/off control (POC) network of a multiple supply voltage device includes detecting a power-on of a second supply voltage while a first supply voltage is already on, decreasing a current capacity of a power on/off detector of the POC network in response to the power-on detection, detecting a power-down of the second supply voltage while the first supply voltage is on, and increasing the current capacity of the power on/off detector in response to the power-down detection.

A system for reducing power consumption in a power on/off control (POC) network of a multiple supply voltage device includes a means for detecting a power-on of a second supply voltage while a first supply voltage is already on. The system further includes means for decreasing a current capacity of a power on/off detector of the POC network responsive to the power-on detection. The system further includes means for detecting a power-down of the second supply voltage while the first supply voltage is on, and means for increasing the current capacity of the power on/off detector responsive to the power-down detection.

The foregoing has outlined rather broadly the features and technical advantages of the present embodiments in order that the detailed description of the disclosure that follows may be better understood. Additional features and advantages of the embodiments will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following descriptions taken in conjunction with the accompanying drawings.

DETAILED DESCRIPTION

Figure 1:
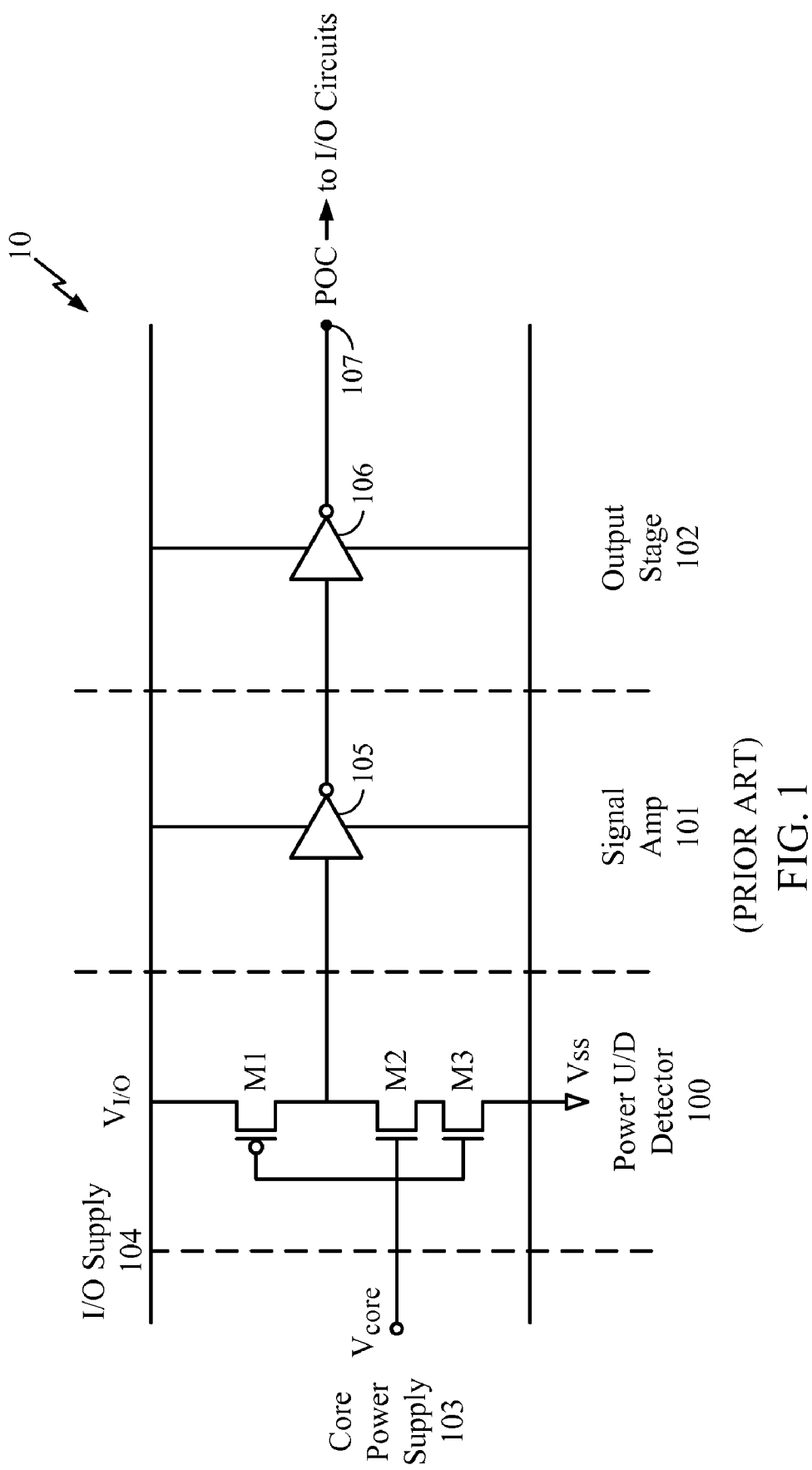
FIG. 1 is a circuit diagram illustrating a conventional POC system for multiple supply voltage devices.
Figure 2:
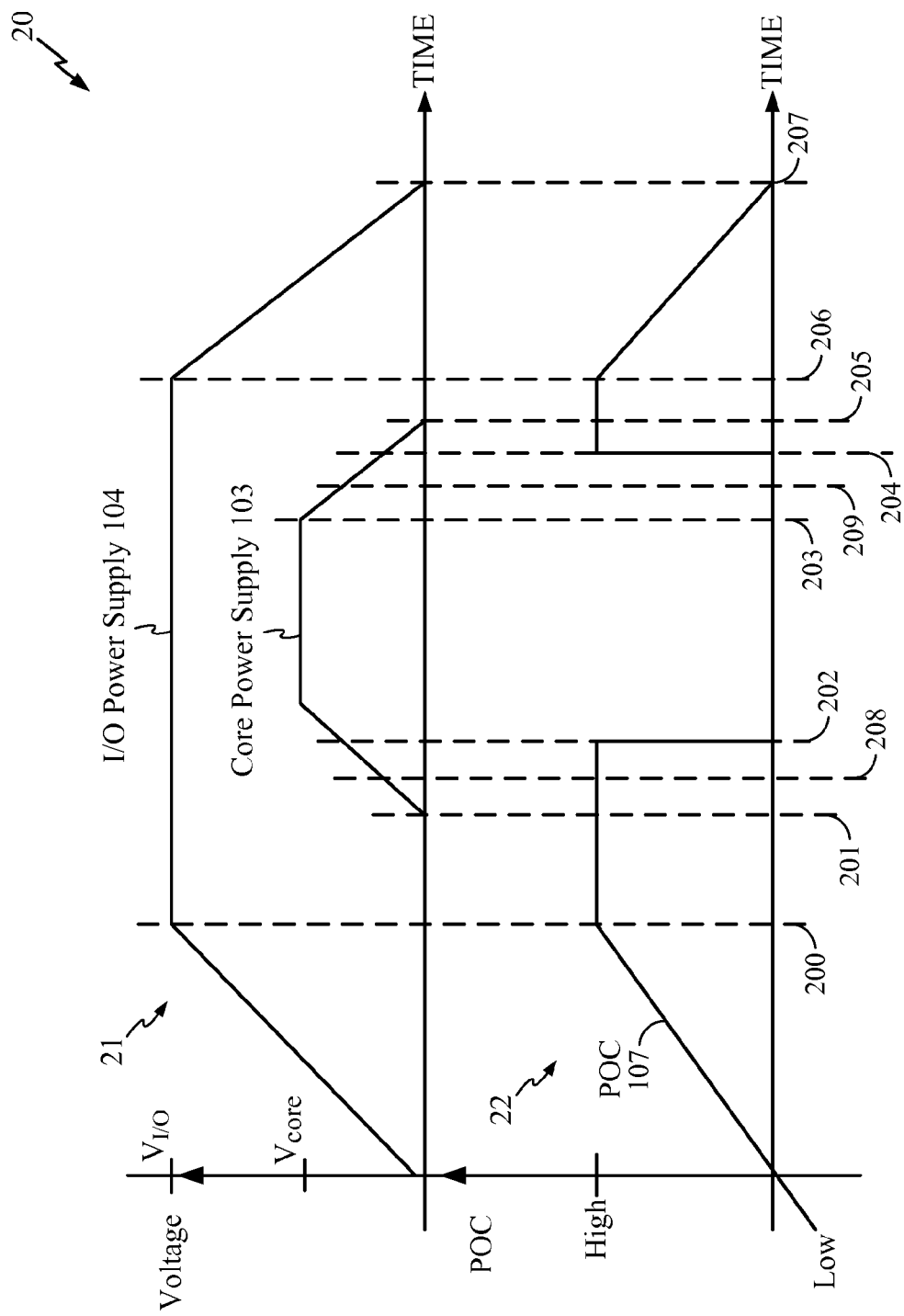
FIG. 2 is an illustration of a diagram presenting the signal interactions in the POC circuit of FIG. 1.
Figure 3A:
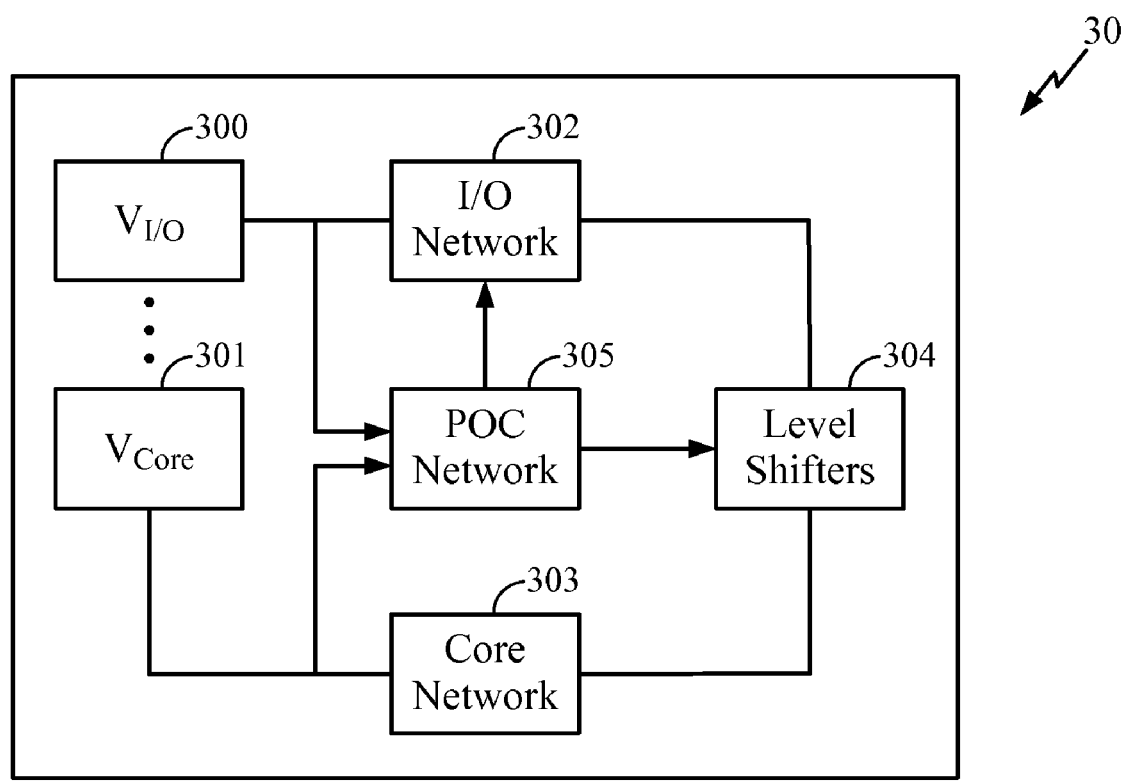
FIG. 3A is a block diagram illustrating an integrated circuit (IC) device having a power on control (POC) network configured according to the teachings of the present disclosure.

Turning now to FIG. 3A, a block diagram is presented illustrating an integrated circuit (IC) device 30 having a power on control (POC) network 305 configured according to one embodiment of the present disclosure. The IC device 30 is an integrated circuit that includes embedded components powered by multiple power supplies, such as the $V_{I/O}$ 300 and the $V_{core}$ 301. The $V_{I/O}$ 300 and the $V_{core}$ 301 supply several different voltage level power supplies to different components and networks within the IC device 30. Two such embedded networks are the I/O network 302 and the core network 303. The I/O network 302 operates at a voltage level provided by the $V_{I/O}$ 300. The Core network 303 operates at a voltage level provided by the $V_{core}$ 301, which is usually a lower voltage than that provided by the $V_{I/O}$ 300. Because the I/O network 302 and the core network 303 operate at different voltages, they are coupled together through level shifters 304 for communication. The level shifters 304 essentially shift the voltage levels of any communications that occur between the I/O network 302 and the core network 303.

POC network 305 senses the status of the core network 303 and transmits a POC signal to the I/O network 302 and level shifters 304. The POC signal either turns them on or off. This prevents stray signals received by the I/O network 302 from being mistakenly transmitted to devices or components external to the IC device 30.

Figure 3B:
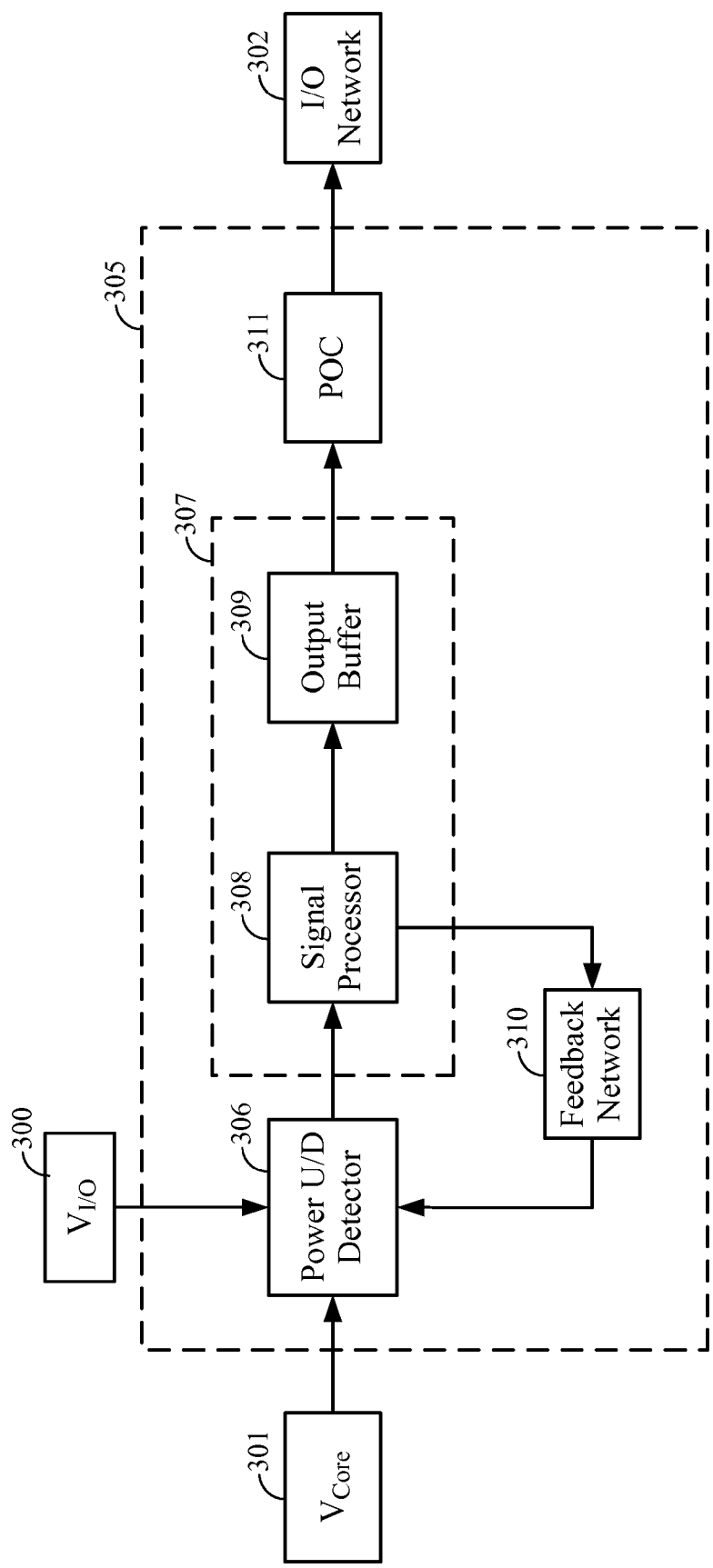
FIG. 3B is a block diagram illustrating a POC network configured according to the teachings of the present disclosure.

FIG. 3B is a block diagram illustrating a POC network 305 configured according to one embodiment of the present disclosure. The POC network 305 includes a power up/down detector 306, processing circuitry 307, and feedback network 310. The processing circuitry 307 is made up of a signal processor 308 and an output buffer 309. When the $V_{I/O}$ 300 is on and the $V_{core}$ 301 is off, the power up/down detector 306 provides a detection signal to the signal processor 308, which processes the detection signal and transmits the processed signal to the output buffer 309. The output buffer 309 then conditions the processed signal into a POC signal 311, which is then transmitted to an I/O network 302. Along the way, a feedback network 310 receives feedback from the signal processor 308 and feeds that signal back to the power up/down detector 306. The power up/down detector 306 uses the feedback signal to adjust its current capacity. While the $V_{core}$ 301 is in an off or low state, the feedback signal allows the power up/down detector 306 to select a maximum current capacity. This maximum current capacity state makes the power up/down detector 306 more sensitive to detecting when the $V_{core}$ 301 either powers-up or powers-down, or both, depending on the circuit configuration of the power up/down detector 306.

When the $V_{core}$ 301 powers-up while the $V_{I/O}$ 300 is on, the power up/down detector 306 detects the power-up and changes the value of the detection signal transmitted to the signal processor 308. The process detection signal is then conditioned by the output buffer 309 into the changed POC signal 311 and transmitted to the I/O network 302. With the changing signals being processed through the signal processing circuitry 307, the feedback network 310 receives the new feedback signal that, when input into power the up/down detector 306, causes the current capacity within the power up/down detector 306 to decrease. This decrease in current capacity will limit and reduce the amount of leakage current that may be dissipated through the power up/down detector 306 because of its connections to the $V_{I/O}$ 300 and the $V_{core}$ 301.

Figure 4:
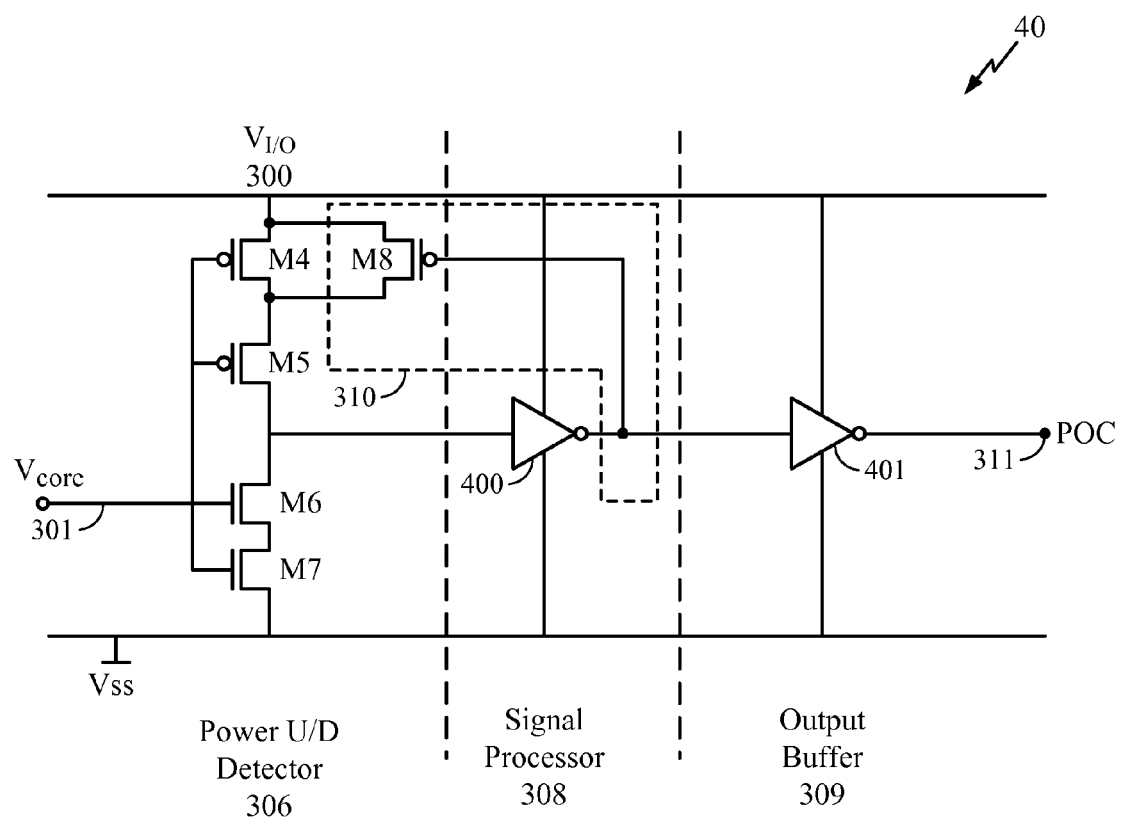
FIG. 4 is a circuit diagram illustrating another POC network configured according to the teachings of the present disclosure.

FIG. 4 is a circuit diagram illustrating a POC network 40 configured according to one embodiment of the present disclosure. The POC network 40 has similar processing regions as the POC network 305 (FIGS. 3A and 3B), i.e., a power up/down detector 306, a signal processor 308, an output buffer 309, and a feedback network 310. The POC network 40 also generates a POC signal 311 and is coupled to a $V_{I/O}$ 300 and a $V_{core}$ 301. As shown in the embodiment illustrated in FIG. 4, the power up/down detector 306 comprises multiple transistors M4-M7 coupled in series together. Each gate of the transistors M4-M7 is coupled to the $V_{core}$ 301, while the source terminal of the transistor M4 is coupled to the $V_{I/O}$ 300. The transistors M4 and M5 are p-type transistors and the transistors M6 and M7 are n-type transistors. Therefore, when the $V_{core}$ 301 is off, i.e., in a low state, the transistors M4 and M5 are switched on, while the transistors M6 and M7 are switched off.

In contrast, when the $V_{core}$ 301 is on, i.e., in a high state, transistors M4 and M5 become very weak while transistors M6 and M7 are strongly switched on. M6 and M7 turning on pulls the voltage of the input to inverting amplifier to $V_{SS}$, which is a logical low signal compared with $V_{I/O}$. $V_{SS}$ is designed as the logical low signal and may comprise ground, 0 V, or some other selected voltage level that represents the logical low symbol. Thus, when the $V_{core}$ 301 is off, the transistors M4 and M5 pull up the voltage level at the input to an inverting amplifier 400 to the $V_{I/O}$ 300. Therefore, the input to the inverting amplifier 400 is high when the $V_{core}$ 301 is off and low when the $V_{core}$ 301 is on. The inverting amplifier 400 then amplifies and inverts the detection signal before transmitting it to the inverting buffer 401 for conditioning and inverting for the POC signal 311.

The feedback network 310 comprises a transistor M8 connected in parallel to the transistor M4. The transistor M8 is also configured as a p-type transistor, such that when the feedback signal from the inverting amplifier 400 is high, the transistor M8 is switched off, and when the feed back signal is low, the transistor M8 is switched on. Thus, when the $V_{core}$ 301 is off, producing a high detection signal, the inverting amplifier 400 inverts that signal to a logic low which causes the transistor M8 to switch on. As the $V_{core}$ 301 is powered-on, the detection signal changes to a logic low, which changes the feedback signal from the inverting amplifier 400 to a logic high, which, in turn, turns the transistor M8 off. While the transistor M8 is off, the power up/down detector 306 has a decreased current capacity, i.e., smaller current will flow through the transistor M8 because of the amplified low signal. The voltage level caused by the $V_{core}$ 301 on the gate terminals of M4 and M5 could in some glitch or stray signal situations, cause leakage through M4 and M5. Because the feedback signal for the transistor M8 is received from the inverting amplifier 400, when the $V_{core}$ 301 powers-down, the feedback signal will switch quickly from a logic high to a logic low, which will then switch the transistor M8 on. Thus, in the circuit configuration depicted in FIG. 4, the power up/down detector 40 will detect the $V_{core}$ 301 powering down more quickly than the existing POC networks.

Figure 5:
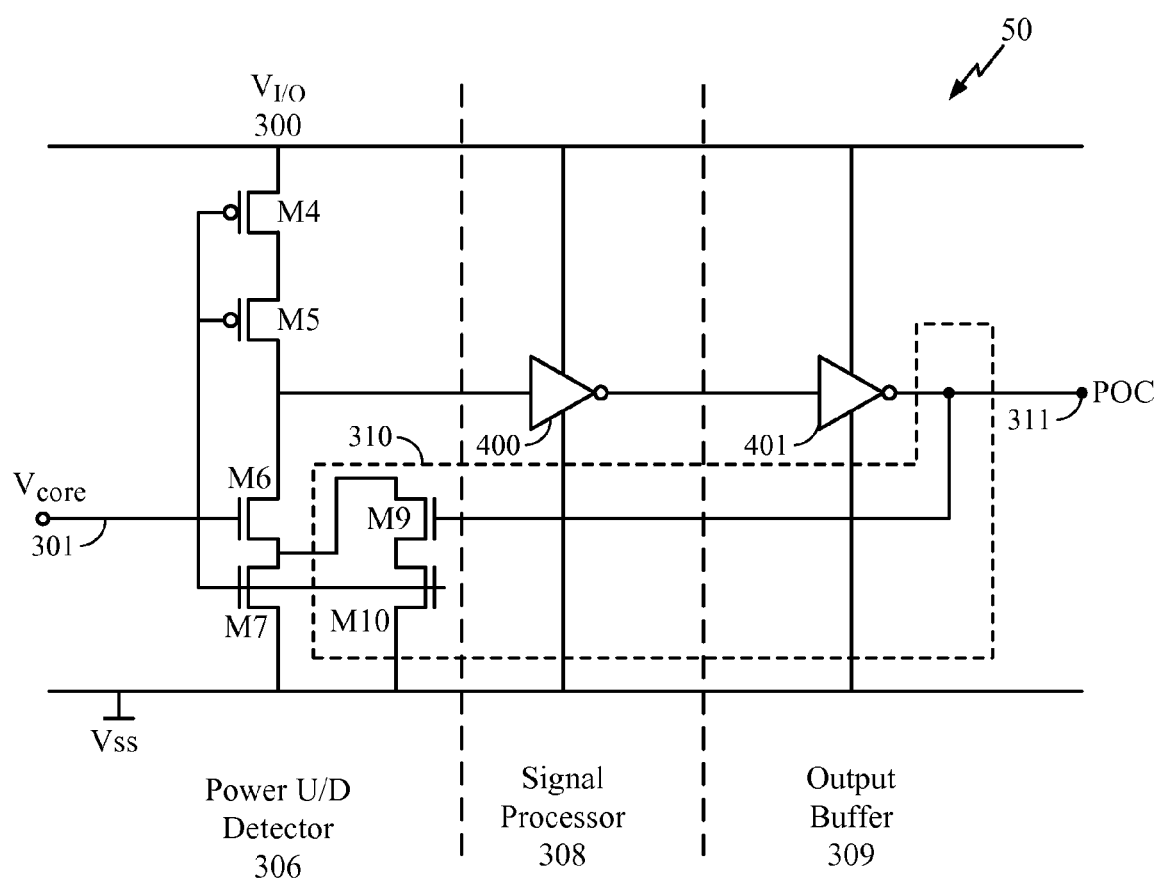
FIG. 5 is a circuit diagram illustrating a further POC network configured according to the teachings of the present disclosure.

FIG. 5 is a circuit diagram illustrating a POC network 50 configured according to one embodiment of the present disclosure. The POC network 50 comprises multiple transistors M4-M7 in the power up/down detector 306 coupled together in a fashion similar to the POC network 40 (FIG. 4) with each gate coupled to a $V_{core}$ 301, and the source terminal of the transistor M4 coupled to a $V_{I/O}$ 300. A signal processor 308 comprises an inverting amplifier 400, and an output buffer 309 includes an inverting buffer 401. The POC network 50 generates a POC signal 311, which will be transmitted to the I/O network to which the POC network 50 is coupled. In the POC network 50, a feedback network 310 is configured with the transistors M9 and M10 coupled in parallel with the transistor M7. The transistors M6, M7, M0, are the same type, n-type or can be low-threshold n-type transistors to speed up the power-on detection. The transistor M9 receives its feedback signal from the output of the inverting buffer 401, while the gate of the transistor M10 is connected to the $V_{core}$ 301.

In operation, when the $V_{I/O}$ 300 is on and the $V_{core}$ 301 is off, the inverting amplifier 400 receives a logic high signal by virtue of the $V_{I/O}$ 300, which, when amplified and inverted by the inverting amplifier 400 and then conditioned and inverted by the inverting buffer 401, provides a logic high feedback signal. This high signal would normally switch M9 in the feedback network 310 on. However, because M6, M7, and M10 are all off, there is no channel formation within the transistor M9 to switch it on. When the $V_{core}$ 301 powers on, M4 and M5 become very weak, while M6, M7, and M10 switch on, which immediately causes M9 to switch on because its gate is already connected to a logic high input. M6 and M7 switching on pulls the input to the inverting amplifier 400 down to a logical low signal, i.e., $V_{SS}$. The low detection signal input to the inverting amplifier 400 is amplified and inverted and then conditioned and inverted again at the inverting buffer 401. Once the inverting buffer 401 outputs a low signal, the feedback of that low to the transistor M9 will switch M9 off, which, because switching M9 off stops the channel formation in the transistor M10, causes the transistor M10 to also switch off. Thus, the configuration of the POC network 50, as illustrated in FIG. 5, operates to detect the $V_{core}$ 301 powering on faster than the existing POC networks, while still reducing the amount of leakage current while the $V_{core}$ 301 is on. The feedback signal used by the transistor M9 allows the power up/down detector 306 to adjust its current capacity, which reduces the leakage current at the same time as the detection speed is improved.

Figure 6:
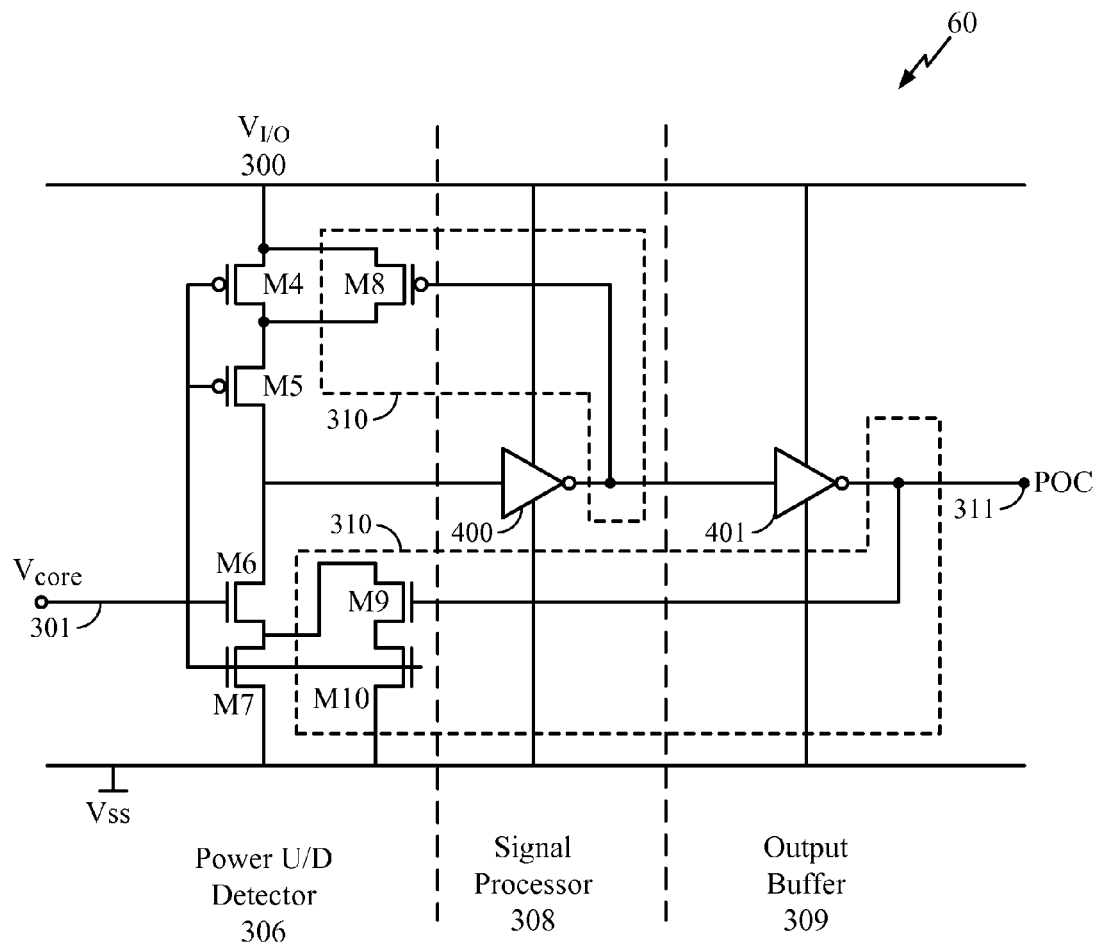
FIG. 6 is a circuit diagram illustrating still another POC network configured according to the teachings of the present disclosure.

FIG. 6 is a circuit diagram illustrating a POC network 60 configured according to one embodiment of the present disclosure. The POC network 60 includes a feedback network 310 configured according to the circuit arrangements of both the POC network 40 (FIG. 4) and the POC network 50 (FIG. 5). As such, multiple transistors M4-M7 make up the power up/down detector 306. The feedback network 310 includes transistor M8, coupled in parallel to the transistor M4, and the transistors M9 and M10, coupled in parallel with the transistor M7. The detection signal from the power up/down detector 306 provides input to an inverting amplifier 400 of a signal processor 308, which amplifies and inverts the detection signal for input to an inverting buffer 401 of an output buffer 309. The conditioned and inverted POC signal 311 is then transmitted to the appropriate I/O and level shifter network of the system. The feedback transistor M8 obtains its feedback signal from the output of the inverting amplifier 400, while the feedback transistor M9 obtains its feedback signal from the output of the inverting buffer 401. Using these feedback signals, as described with respect to the POC network 40 (FIG. 4) and the POC network 50 (FIG. 5), the POC network 60 is able to increase the speed that the $V_{core}$ 301 is quickly detected both in the power-on and power-off stages. At the same time, because the feedback network 310 provides the capability of the POC network 60 to adjust the current capacity of the power up/down detector 306, the unwanted leakage current can also be reduced during the $V_{core}$ 301 normal operation periods.

It should be noted that each of the embodiments described with respect to the POC network 40 (FIG. 4), the POC network 50 (FIG. 5), and the POC network 60 (FIG. 6) has its own advantages. For example, the POC network 50 (FIG. 5) is able to have a considerably improved performance characteristic with the addition of very small thin-oxide circuitry to the overall silicon. Thus, each of the illustrated embodiments, as well as the various additional and/or alternative embodiments of the present disclosure represent improvements over the existing systems and methods.

Figure 7:
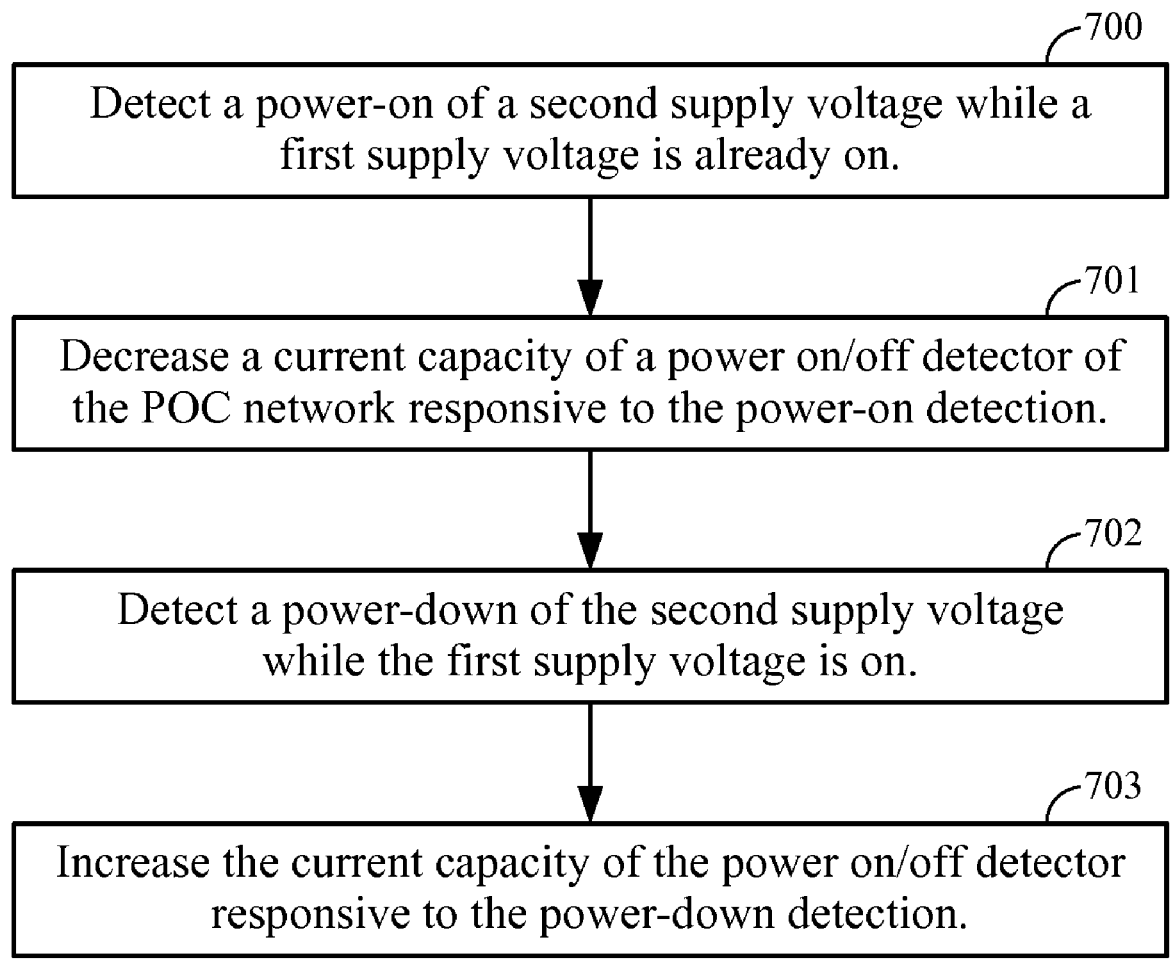
FIG. 7 is a flowchart illustrating process blocks for implementing one embodiment according to the teachings of the present disclosure.

FIG. 7 is a flowchart illustrating process blocks for implementing one embodiment of the present disclosure. In block 700, a power-on of a second supply voltage is detected while a first supply voltage is already on. At block 701 a current capacity of a power on/off detector of the POC network is decreased responsive to the power-on detection. At block 702 a power-down of the second supply voltage is detected while the first supply voltage is on. At block 703 the current capacity of the power on/off detector is increased responsive to the power-down detection.

Some embodiments of an exemplary wireless communication system include multiple remote units and multiple base stations. It can be recognized that typical wireless communication systems may have many more remote units and base stations. The remote units include multiple semiconductor devices having power detection, as discussed above. Embodiments include forward link signals from the base stations and the remote units and reverse link signals from the remote units to the base stations.

In other embodiments, a remote unit is a mobile telephone, another remote unit is a portable computer, and another remote unit is a fixed location remote unit in a wireless local loop system. For example, the remote units may be mobile phones, hand-held personal communication systems (PCS) units, portable data units such as personal data assistants, navigation devices (e.g., GPS enabled devices,) set-top boxes, music players, video players, entertainment units, fixed location data units such as meter reading equipment, or any other device that stores or retrieves data or computer instructions, or any combination thereof. Although these embodiments illustrates remote units according to the teachings of the disclosure, the disclosure is not limited to these exemplary illustrated units. The disclosed device may be suitably employed in any device which includes a semiconductor device.

Although specific circuitry has been set forth, it will be appreciated by those skilled in the art that not all of the disclosed circuitry is required to practice the disclosure. Moreover, certain well known circuits have not been described so as to maintain focus on the disclosure. Similarly, although the description refers to logical "0" or "low" and logical "1" or "high" in certain locations, one skilled in the art appreciates that the logical values can be switched, with the remainder of the circuit adjusted accordingly, without affecting operation of the present disclosure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the embodiments of the present disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A multiple supply voltage device comprising:
   a core network operative at a first supply voltage; and
   a control network coupled to said core network wherein said control network is configured to transmit a control signal, said control network comprising: an up/down (up/down) detector configured to detect a power state of said core network; processing circuitry coupled to said up/down detector and configured to generate said control signal based on said power state;
   one or more feedback circuits coupled to said up/down detector, said one or more feedback circuits configured to provide feedback signals to adjust a current capacity of said up/down detector;
   at least one first transistor coupled to a second supply voltage, the at least one more first transistor being configured to switch on when said first supply voltage is powered down and to switch off when said first supply voltage is powered on;
   at least one second transistor coupled in series with the at least one first transistor and coupled to said first supply voltage, the at least one second transistor being configured to switch on when said first supply voltage is powered on and to switch off when said first supply voltage is powered down;

at least one third transistor coupled in series between the at least one first transistor and the at least one second transistor.

2. The multiple supply voltage device of claim 1 wherein said one or more feedback circuits comprise:
one or more first feedback transistors coupled in parallel with said one or more first transistors and coupled to receive feedback from said processing circuitry, wherein said one or more first feedback transistors are configured to switch off when said processing circuitry indicates that said first supply voltage is powered on.

3. The multiple supply voltage device of claim 1 wherein said one or more feedback circuits comprise:
one or more second feedback transistors coupled in parallel with said one or more second transistors and coupled to receive feedback from said processing circuitry, wherein said one or more second feedback transistors are configured to switch off when said processing circuitry indicates that said first supply voltage is powered on.

4. The multiple supply voltage device of claim 1 wherein said one or more feedback circuits comprise:
one or more first feedback transistors coupled in parallel with said one or more first transistors and coupled to receive feedback from said processing circuitry; and
one or more second feedback transistors coupled in parallel with said one or more second transistors and coupled to receive feedback from said processing circuitry;
wherein said one or more first and second feedback transistors are configured to switch off when said processing circuitry indicates that said first supply voltage is powered on.

5. The multiple supply voltage device of claim 1 further comprising:
an input/output (I/O) network operative at a second supply voltage, wherein said I/O network is coupled to said core network and said control network, and wherein said I/O network is configured to receive said control signal.

6. The multiple supply voltage device of claim 1, in which the device is integrated into a semiconductor die.

7. The multiple supply voltage device of claim 6, in which the semiconductor die is incorporated in a device selected from a group consisting of a mobile phone, personal data assistant (PDA), navigation device, fixed location data unit, set-top box, music player, video player, entertainment unit, and computer.

8. A method for reducing power consumption in a power on/off control (POC) network of a multiple supply voltage device, said method comprising:
detecting a power-on of a second supply voltage while a first supply voltage is already on;
decreasing a current capacity of a power on/off detector of said POC network in response to said power-on detection;
detecting a power-down of said second supply voltage while said first supply voltage is on;
increasing said current capacity of said power on/off detector in response to said power-down detection;
receiving a logic-high signal at a control gate of at least one first transistor, at least one second transistor and at least one third transistor coupled in series between the at least one first transistor and the at least one second transistor, the at least one first transistor being configured to switch off in response to said logic-high signal, and the at least one second transistor being configured to switch on in response to said logic-high signal; and
transmitting a detection signal to a signal processor from the at least one second transistor based on said received logic-high signal.

9. The method of claim 8 wherein said decreasing said current capacity comprises:
receiving a first feedback signal from said signal processor at one or more first feedback transistors coupled in parallel with said one or more first transistors; and
switching off said one or more first feedback transistors in response to said first feedback signal.

10. The method of claim 8 wherein said decreasing said current capacity comprises:
receiving a second feedback signal from an output buffer of said POC network at one or more second feedback transistors coupled in parallel with said one or more second transistors; and
switching off said one or more second feedback transistors in response to said second feedback signal.

11. The method of claim 8 wherein said decreasing said current capacity comprises:
receiving a first feedback signal from said signal processor at one or more first feedback transistors coupled in parallel with said one or more first transistors;
switching off said one or more first feedback transistors in response to said first feedback signal;
receiving a second feedback signal from an output buffer of said POC network at one or more second feedback transistors coupled in parallel with said one or more second transistors; and
switching off said one or more second feedback transistors in response to said second feedback signal.

12. The method of claim 8 wherein said detecting said power-down comprises:
receiving a logic-low signal at said control gate of said one or more first and second transistors, wherein said one or more first transistors are configured to switch on in response to said logic-low signal, and wherein said one or more second transistors are configured to switch off in response to said logic-low signal; and
transmitting a detection signal to a signal processor from said one or more first transistors based on said received logic-low signal.

13. The method of claim 12 wherein said increasing said current capacity comprises:
receiving a first feedback signal from said signal processor at one or more first feedback transistors coupled in parallel with said one or more first transistors; and
switching on said one or more first feedback transistors in response to said first feedback signal.

14. The method of claim 12 wherein said increasing said current capacity comprises:
receiving a second feedback signal from an output buffer of said POC network at one or more second feedback transistors coupled in parallel with said one or more second transistors; and
switching on said one or more second feedback transistors in response to said second feedback signal.

15. The method of claim 12 wherein said increasing said current capacity comprises:
receiving a first feedback signal from said signal processor at one or more first feedback transistors coupled in parallel with said one or more first transistors;
switching on said one or more first feedback transistors in response to said first feedback signal;

receiving a second feedback signal from an output buffer of said POC network at one or more second feedback transistors coupled in parallel with said one or more second transistors; and switching on said one or more second feedback transistors in response to said second feedback signal.

16. The method of claim 8, wherein the multiple supply voltage device is applied in an electronic device, selected from a group consisting of a set top box, music player, video player, entertainment unit, navigation device, communications device, personal digital assistant (PDA), fixed location data unit, and a computer, into which a semiconductor device is integrated.

17. A system for reducing power consumption in a power on/off control (POC) network of a multiple supply voltage device, said system comprising:

means for detecting a power-on of a second supply voltage while a first supply voltage is already on;

means, responsive to said power-on detection, for decreasing a current capacity of a power on/off detector of said POC network;

means for detecting a power-down of said second supply voltage while said first supply voltage is on;

means, responsive to said power-down detection, for increasing said current capacity of said power on/off detector;

means for receiving a logic-high signal at a control gate of at least one first transistor, at least one second transistor and at least one third transistor coupled in series between the at least one first transistor and the at least one second transistor, the at least one first transistor being configured to switch off in response to said logic-high signal, and the at least one second transistor being configured to switch on in response to said logic-high signal; and means for transmitting a detection signal to a signal processor from the at least one second transistor based on said received logic-high signal.

18. The system of claim 17 further comprising:

means for providing a feedback signal associated with at least one of: said detected power-on or said detected power-down, wherein said feedback signal is used in said means for decreasing and said means for increasing.

19. The system of claim 18 wherein said means for decreasing said current capacity comprises:

means, responsive to said feedback signal, for switching off one or more transistors of a plurality of transistors, wherein said plurality of transistors define said current capacity of said power on/off detector.

20. The system of claim 18 wherein said means for increasing said current capacity comprises:

means, responsive to said feedback signal, for switching on one or more transistors of a plurality of transistors, wherein said plurality of transistors define said current capacity of said power on/off detector.

21. The multiple supply voltage device of claim 17, in which the device is integrated into a semiconductor die.

22. The multiple supply voltage device of claim 21, in which the semiconductor die is incorporated in a device selected from a group consisting of a mobile phone, personal data assistant (PDA), navigation device, fixed location data unit, set-top box, music player, video player, entertainment unit, and computer.

* * * * *